United States Patent [19]

Yoo et al.

[11] Patent Number: 5,707,892
[45] Date of Patent: Jan. 13, 1998

[54] METHOD FOR FABRICATING A SEMICONDUCTOR LASER DIODE

[75] Inventors: Tae Kyung Yoo, Seoul; Meoung Whan Cho; Ju Ok Seo, both of Kyungki-do; Shi Jong Leem; Min Soo Noh, both of Seoul, all of Rep. of Korea

[73] Assignee: LG Electronics, Inc., Seoul, Rep. of Korea

[21] Appl. No.: 560,714

[22] Filed: Nov. 20, 1995

[30] Foreign Application Priority Data

Nov. 19, 1994 [KR] Rep. of Korea ............. 30494/1994

[51] Int. Cl.⁶ ........................................... H01L 21/20
[52] U.S. Cl. ..................... 437/129; 437/126; 437/130
[58] Field of Search ............................. 437/129, 126, 437/130; 372/42, 44

[56] References Cited

U.S. PATENT DOCUMENTS

| | | | |
|---|---|---|---|
| 4,558,448 | 12/1985 | de Poorter et al. | 372/44 |
| 4,677,634 | 6/1987 | Meuleman et al. | 372/46 |
| 4,904,617 | 2/1990 | Muschke | 437/129 |
| 5,413,956 | 5/1995 | Watanabe et al. | 47/129 |
| 5,436,196 | 7/1995 | Miyashita | 437/129 |

*Primary Examiner*—Tuan H. Nguyen
*Assistant Examiner*—Ramamohan Rao Paladugu
*Attorney, Agent, or Firm*—Morgan, Lewis & Bockius LLP

[57] ABSTRACT

A method for fabricating a semiconductor laser diode includes the steps of forming a double hetero structured semiconductor layer on a substrate, forming a dielectric layer on the double hetero structured semiconductor layer, selectively etching the dielectric layer to expose a portion of the double hetero structured semiconductor layer, selectively removing the exposed semiconductor layer using the dielectric layer as a mask by liquid phase etching, and re growing a semiconductor layer on the etched portion by liquid phase epitaxy.

18 Claims, 9 Drawing Sheets

F I G.7d
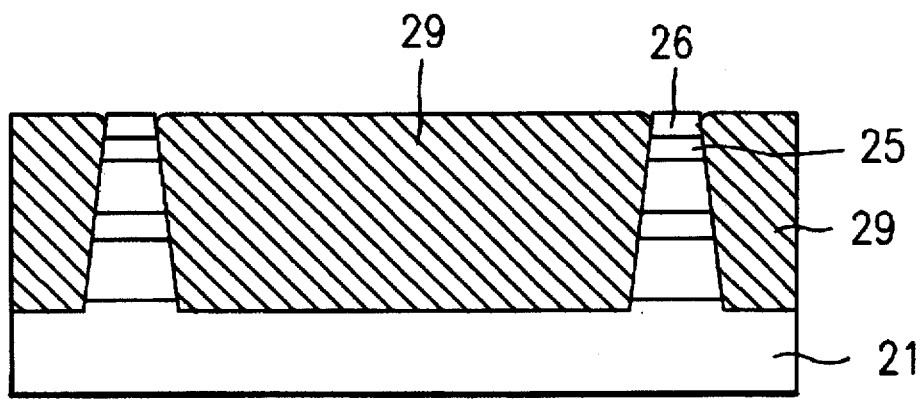
F I G.7e
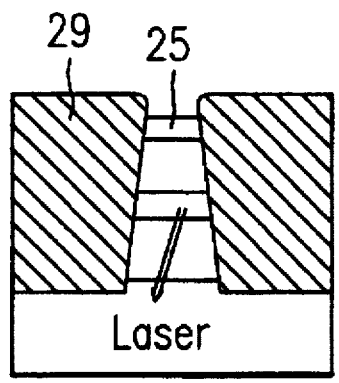

METHOD FOR FABRICATING A SEMICONDUCTOR LASER DIODE

BACKGROUND OF THE INVENTION

1. Field of the Invention

The present invention relates to a semiconductor laser diode, and more particularly to a method for performing etching and regrowth of a semiconductor layer of a semiconductor laser diode.

2. Discussion of the Related Art

FIG. 1 illustrates a general semiconductor laser diode having a double hetero (DH) structure.

A general semiconductor laser diode is formed by sequentially stacking an n-type clad layer, an active layer, a p-type clad layer and a p-type cap layer on a substrate. The semiconductor laser diode has an oscillating mirror as a solid laser diode or a gas laser diode. The oscillating mirror is formed by an orientational cleavage which is characteristic of the semiconductor, and a distance between the mirrors defines a cavity.

When a negative (−) voltage is applied to the n-type clad layer and a positive (+) voltage is applied to the p-type clad layer of the semiconductor laser diode, electrons are coupled with holes in the active layer, thereby generating an output beam which oscillates according to the oscillating mirror. The oscillating beam is emitted through the mirror plane. Accordingly, laser characteristics are greatly affected by the condition of the mirror plane. That is, favorable laser beam characteristics can be obtained by having a flat, clear, and damage-free mirror planes arranged parallel to each other. The mirror planes define the cavity.

However, the semiconductor laser specifically having semiconductor material which directly contacts air at the mirror plane requires an important considerations.

Since the mirror of the semiconductor layer is formed by cleaving the semiconductor using its orientational characteristics, the mirror becomes a boundary of the semiconductor having different properties from the interior of the semiconductor. For example, dangling bonds remain in the boundary of the semiconductor which then oxidize with oxygen from the air. Also, there is a semiconductor defect.

Once current is injected to the semiconductor laser, a photon is produced by a light-emitting reunion of an electron and a hole within an active region. The photon is amplified while reciprocating between the mirrors that define the cavity before the laser beam is emitted. At this time, a wavelength of the emitted light is the same as an energy gap of the active region material.

The mirror plane acts in two ways until the laser beam is emitted into the air. The mirror plane serves as both a reflection plane for amplifying the photon and as a transmission plane for transmitting the laser beam.

Here, by a cycling of inducing a light concentration phenomenon upon the mirror plane, uniting with the dangling bond on the mirror plane when a photon is absorbed by the oxide layer, and re-uniting on a non-emitting basis, the mirror is instantaneously damaged. If the mirror is damaged, the semiconductor laser will not operate. This phenomenon is called Catastrophic Optical Damage (COD) which frequently occurs during high output operation.

FIG. 2 represents a current characteristic with respect to an optical output a COD phenomenon occurs. Here, the COD level is defined by dividing a current value at the maximum optical output by an area of a light-emitting plane of the semiconductor laser. For example, if the maximum value of the current is 100 mW and the area of the light-emitting plane is 5 $\mu m^2$, the COD level is 2 $MW/cm^2$.

In a high output semiconductor laser, the COD level becomes the important value. As this value increases, the semiconductor laser can achieve higher output operation. Two factors that impede increasing the COD level may be briefly examined.

First, in the mirror plane, which is the semiconductor boundary, defects caused during the process can be eliminated by improving the process to reduce the process steps, but dangling bonds and the resulting oxidization are inherent problems.

Second, excessive optical power concentrated on the mirror plane can be solved by enlarging the light-emitting area and by preventing the light from being absorbed into the mirror plane. That is, the mirror is formed of a material having a lower refractive index and a greater energy gap than those of the active layer material.

The material having a lower refractive index allows the light to spread, thereby widening the light-emitting area on the mirror plane and allowing an optical density to be lowered. The COD is therefore increased. In addition, if the energy gap is large, the oscillating light is not absorbed, and the cycle of light absorbing and non-emitting reuniting generated at the mirror is removed. Consequently, the damage to the mirror is eliminated. A mirror formed in this manner is referred to as a transparent mirror (TM).

FIGS. 3a to 3d are sectional views showing a process of fabricating the conventional semiconductor laser diode having a TM layer.

As shown in FIG. 3a, an n-clad layer 2, an active layer 3 and a p-clad layer 4 are sequentially grown on a substrate 1 using a vapor phase epitaxy such as a metal organic chemical vapor deposition (MOCVD) or molecular beam epitaxy (MBE) or liquid phase epitaxy (LPE) to form the DH structure.

A p-cap layer 5 is formed on the resultant structure, and a dielectric layer 6 such as silicon dioxide ($SiO_2$) or silicon nitride ($Si_3N_4$) is deposited on p-cap layer 5 using a plasma enhanced chemical vapor deposition (PECVD). Here, dielectric layer 6 serves as a mask for blocking the deposition from the upper side of dielectric layer 6 in case of a regrowth.

As shown in FIG. 3b, a photoresist layer PR is deposited on dielectric layer 6, and a cavity region and a mirror region are defined by a photolithography process to etch the dielectric layer 6 and the DH structure of the mirror region down to the surface of substrate 1.

Successively, as shown in FIG. 3c, a TM layer 7 having a lower refractive index and greater energy gap than those of active layer 13 is regrown on the etched portion using vapor phase epitaxy or LPE.

Thereafter, as shown in FIG. 3d, dielectric layer 6 is removed, and a semiconductor laser diode chip is fabricated via scribing and breaking processes.

The semiconductor laser diode fabricated as above has the cleaved mirror plane filled with the material having the lower refractive index and greater energy gap than those of the active layer to heighten the COD level. Therefore, the semiconductor laser diodes can achieve high output.

The semiconductor laser diode illustrated in FIG. 3 heightens the COD level and enables high output, but also causes problems with long term reliability. That is, when etching the DH structure of FIG. 3b, an etchant chemically removes the semiconductor material, and the portion exposed to the etchant is damaged, thereby creating a defect. Also, since the etching is carried out in an ambient atmosphere, the oxygen in the air combines with the etched plane resulting in oxidization. The defect and oxidization may cause leakage current when injecting the current and heat from the absorption of the laser beam passing therethrough thereby causing an abrupt deterioration of the semiconductor laser. Moreover, since the oxidization results in a defect that impedes the regrown semiconductor from having good layer quality, the regrowth of the TM layer may be blocked.

FIG. 4a is a sectional view showing a structure of the semiconductor laser diode having a strip type DH structure formed with p-type and n-type metal electrodes. An active layer 13 is sandwiched on a substrate 11 between n-type and p-type clad layers 12 and 14, having lower refractive indices and greater energy gaps. Here, the clad layers confine light generated from the active layer to remain in the active layer.

A p-type cap layer 15 is formed on p-type clad layer 14, and a p-type metal electrode 16 and an n-type metal electrode 17 are respectively formed to the upper portion of p-type cap layer 15 and the rear plane of p-type metal electrode 16. The p-type metal electrode 16 is formed on a predetermined portion of p-type cap layer 15 as strips.

The semiconductor laser diode constructed as above has the following characteristics.

When using a general thin film deposition method (e.g., LPE, MOCVD and MBE), the thin film is grown in the vertical direction of the substrate, so that it is easy to grow the clad layer of the material having a lower refractive index and greater energy gap on/below the active layer in the vertical direction.

A principle of confining the light uses the full reflection produced when the light is incident from a material of high refractive index to a material of a low refractive index. That is, if the difference of the refractive indices is large, full reflection is easily achieved, thereby facilitating light confinement. The refractive index of the active layer can be made different from that of the clad layer by using different materials.

However, as can be noted in FIG. 4b which is an enlargement view of a portion of FIG. 4a, the material of the active layer does not change in the horizontal direction to inhibit the light confinement. If the light is not confined, the lower current oscillation becomes difficult and a single mode oscillation is also impossible. A simple solution is to reduce the width of the strip to allow a portion contacting the active layer to be an area I in the enlargement view of portion A. Area I has higher electron-hole pair density than an area II, and this density difference serves as a factor in making the refractive index of area I greater than that of area II. If the difference in the refractive index between area I and area II is greater than $10^{-4}$, the light confinement phenomenon can be achieved. This difference in the refractive indices is not an actual difference resulting from different materials but an effective index of refraction difference. Moreover, since the electron-hole pair density cannot be infinitely increased, the index difference is significantly smaller than the real index. In other words, the general DH structure easily realizes an up-and-down real index guiding in the vertical direction of the active layer, but involves relatively very weak effective index guiding in the horizontal direction of the active layer. A width W of area I involves an important indication that the greater width makes the lower current oscillating difficult and impedes the single mode oscillation. In order to reduce width W, the strip width is reduced and the doping of the p-clad layer is lowered. However, both methods can be adopted only to an extent since a resistance is increased in view of the current. The ultimate solution is to form a clad layer capable of confining current and light in the horizontal direction of the active layer. At this time, a requisite is for utilizing a material having a lower refractive index and a greater energy gap than those of the active layer. A laser diode having such an internal structure is referred to as a buried hetero (BH) structured laser diode. The BH-structured laser diode has a strong structural characteristic of enabling lower current oscillation and single mode oscillation.

FIGS. 5a and 5d are sectional views showing a process for fabricating the conventional BH-structured semiconductor laser diode.

As shown in FIG. 5a, an n-type clad layer 12, an active layer 13, a p-type clad layer 14, and a p-type cap layer 15 are sequentially grown on a substrate 11 via vapor phase epitaxy such as MOCVD and MBE, or LPE to form the DH structure. A dielectric layer 18 is formed thereon via PECVD.

Referring to FIG. 5b, a photoresist layer 19 is deposited on dielectric layer 18 and is patterned by photolithography. Then, dielectric layer 18 is removed with HF. Next, the DH structure is etched down to substrate 11 via an etching process.

As shown in FIG. 5c, a second clad layer 20, having a lower refractive index and greater energy gap than those of the active layer, is grown on the etched portion via vapor phase epitaxy or LPE. Second clad layer 20 is formed from a single layer with a low doping density (approximately below $10^{16}$) or a multilayered current blocking layer having a pnpn thyristor structure for enabling low current oscillation by the current confinement as well as the light confinement.

In FIG. 5d, dielectric layer 18 is eliminated, and a chip fabricating process is performed to complete the single chip of the semiconductor laser diode.

The BH-structured laser diode fabricated as above enables the lower current oscillation of the single mode because the light confinement and current confinement are attained by real index guiding in both the vertical and horizontal directions of the active layer.

However, even though the above-described BH-structured semiconductor laser diode enables lower current oscillation in the single mode, it has problems with reliability.

More specifically, because etching the DH structure as shown in FIG. 5b chemically eliminates the semiconductor material, the portion exposed to the etchant is damaged and may generate defects. Moreover, the etching process is performed in an ambient atmosphere so that the etched plane is oxidized by oxygen in the air. The defect and oxidation are the cause of leakage current and serve as a heat source from the non-emitting reunion after absorption of the laser beam. Consequently, abrupt degradation of the semiconductor laser may occur.

Furthermore, the oxidization impedes the regrown semiconductor from having good layer quality when regrowing the second clad layer, thereby making it impossible to regrow the second clad layer, so that the BH laser can not be fabricated.

SUMMARY OF THE INVENTION

Accordingly, the present invention is directed to a method for fabricating a semiconductor laser diode that substantially obviates one or more of the problems due to limitations and disadvantages of the related art.

An object of the present invention is to provide a method for fabricating a high output semiconductor laser diode having high reliability.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for fabricating a semiconductor laser diode includes the steps of forming a double hetero structured semiconductor layer on a substrate, forming a dielectric layer on the double hetero structured semiconductor layer, selectively removing the dielectric layer to expose a portion of the double hetero structured semiconductor layer, selectively etching the exposed semiconductor layer using the dielectric layer as a mask by liquid phase etching, and regrowing a semiconductor layer on the etched portion by liquid phase epitaxy.

In another aspect, the method for fabricating a semiconductor laser diode includes the steps of growing a first clad layer on a substrate, growing an active layer on the first clad layer, growing a second clad layer on the active layer, forming a dielectric layer on the second clad layer, selectively removing the dielectric layer to expose a portion of the second clad layer, selectively removing the first clad layer, the active layer, and the second clad layer by liquid phase etching using the dielectric layer as a mask, and regrowing a semiconductor layer on the removed portion by liquid phase epitaxy.

In accordance with the present invention, there is provided a method for fabricating a semiconductor laser diode, in which a DH-structured semiconductor layer is formed on a substrate, and a dielectric layer is formed on the semiconductor layer. Then, the dielectric layer is selectively etched to expose a predetermined portion of the semiconductor layer, and the exposed semiconductor layer is selectively etched by liquid phase etching using the dielectric layer as a mask. Successively, the semiconductor layer is regrown on the etched portion by liquid phase epitaxy.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 7a to 7e are sectional views of a process for fabricating the semiconductor laser diode according to a second embodiment of the present invention;

DETAILED DESCRIPTION OF THE PREFERRED EMBODIMENTS

Reference will now be made in detail to the preferred embodiments of the present invention, examples of which are illustrated in the accompanying drawings.

FIGS. 6a to 6e are sectional views showing a process of fabricating the semiconductor laser diode according to a first embodiment of the present invention.

Figure 1:
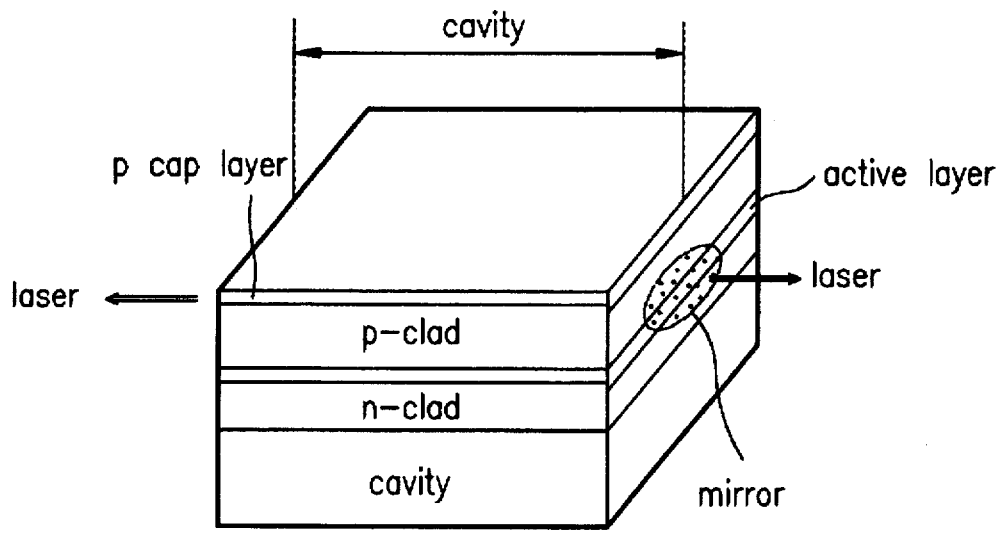
FIG. 1 is a sectional view of a conventional DH structured semiconductor laser diode.
Figure 2:
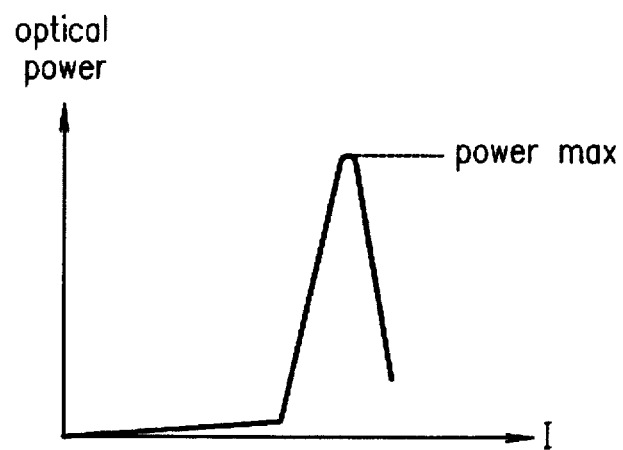
FIG. 2 is a plot of current characteristics for a conventional semiconductor laser diode with respect to an optical power to illustrate the COD phenomenon.
Figure 3A:
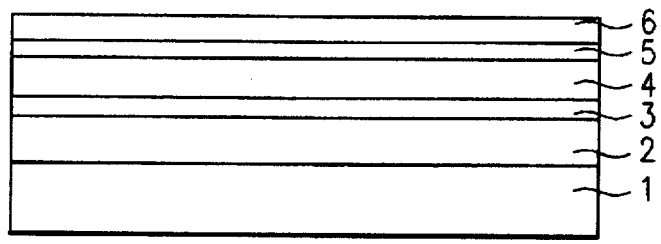
FIGS. 3a to 3d are sectional views of a process for fabricating a semiconductor laser diode having a TM layer.
Figure 3B:
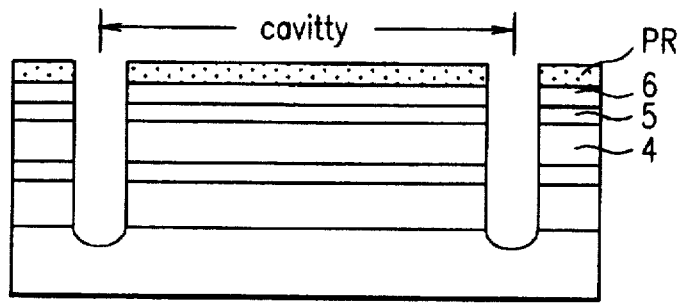
Figure 3C:
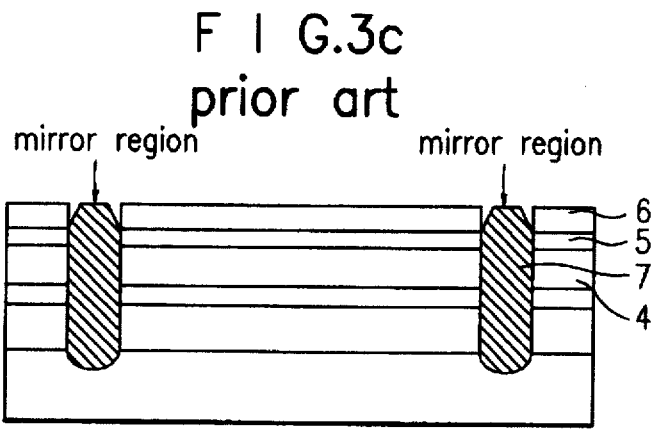
Figure 3D:
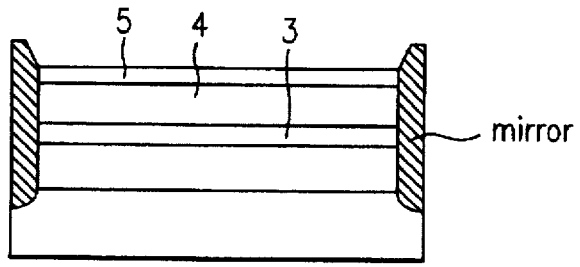
Figure 4A:
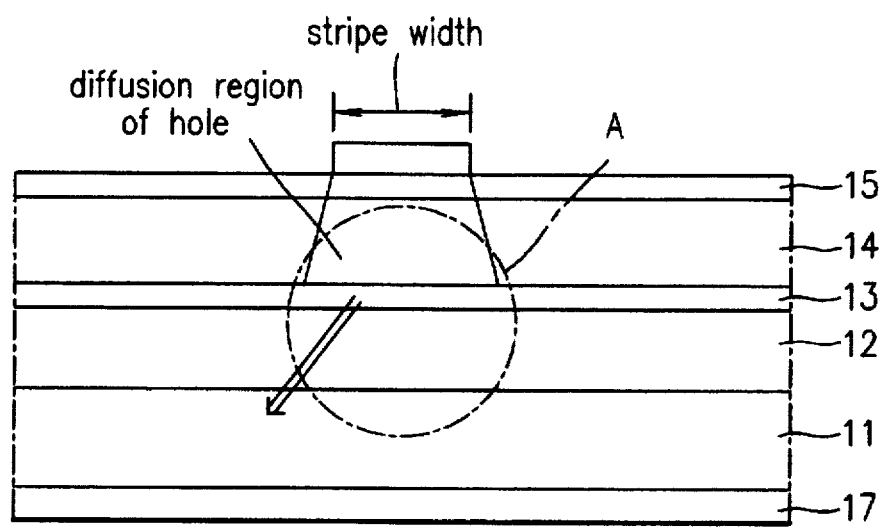
FIGS. 4a and 4b show sectional views of a conventional BH-structured semiconductor laser diode.
Figure 4B:
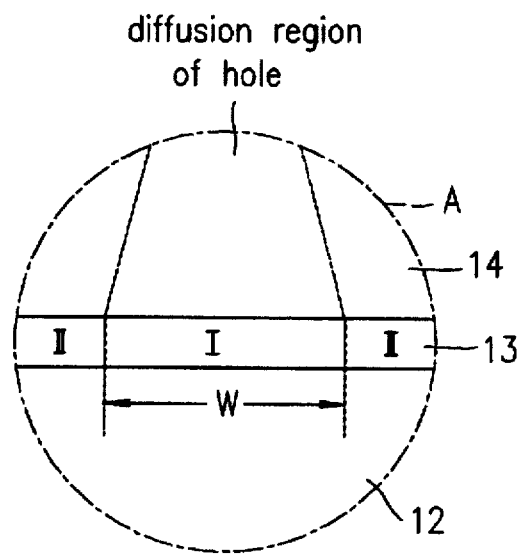
Figure 5A:
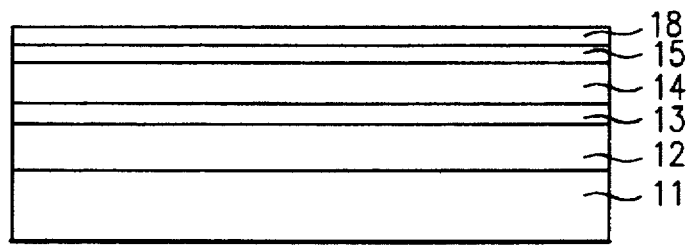
FIGS. 5a to 5d are sectional views of a process for fabricating the conventional BH-structured semiconductor laser diode.
Figure 5B:
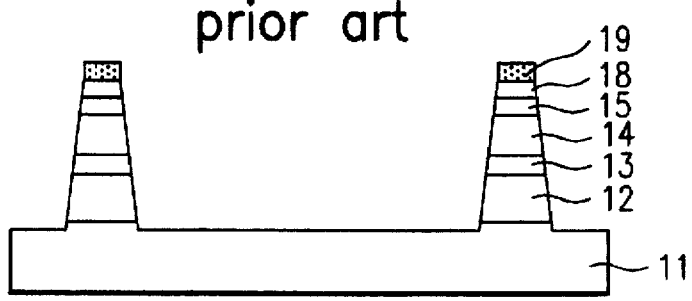
Figure 5C:
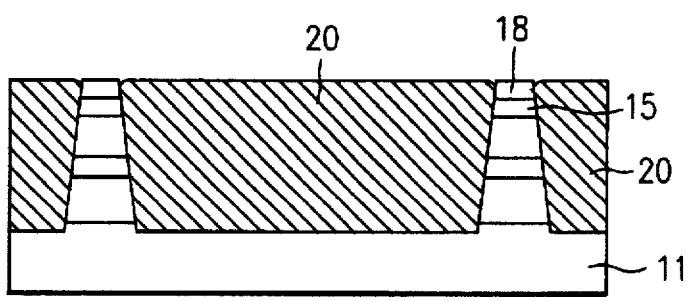
Figure 5D:
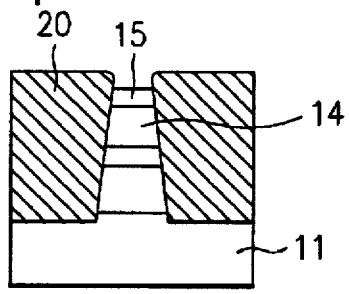
Figure 6A:
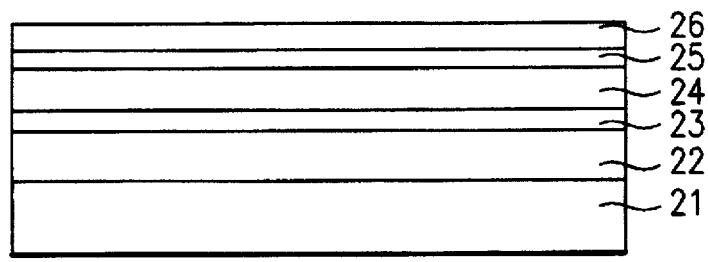
FIGS. 6a to 6e are sectional views of a process for fabricating a semiconductor laser diode according to a first embodiment of the present invention.

As shown in FIG. 6a, an n-type clad layer 22, an active layer 23, a p-type clad layer 24, and a p-type cap layer 25 are sequentially grown on a substrate 21 via a vapor phase epitaxy such as an MOCVD and MBE or an LPE to form a DH structure. Thereafter, a dielectric layer 26 of $SiO_2$ or $Si_3N_4$ is deposited on p-type cap layer 25 via PECVD.

Figure 6B:
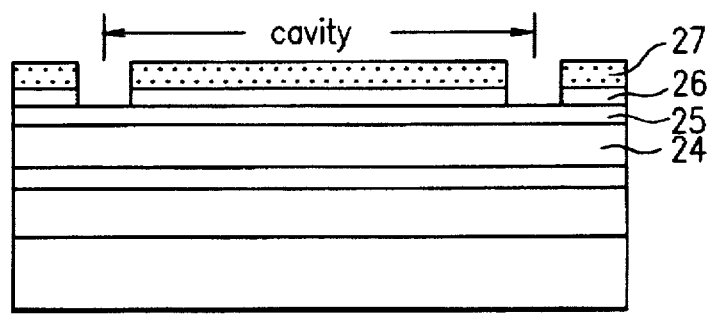

Referring to FIG. 6b, a photoresist layer 27 is deposited on dielectric layer 26, and a mirror region is defined by a width of a cavity created by photolithography. In this step, a portion of the dielectric layer 26 at the mirror region is selectively removed using HF.

Figure 6C:
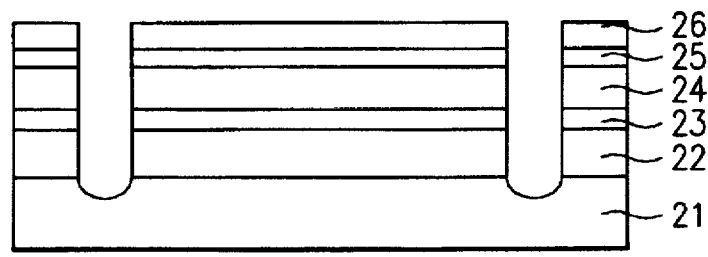

As shown in FIG. 6c, the resultant structure is put in an LPE reactor to perform a liquid phased etch. The principles and characteristics of liquid phase etching will now be explained.

When a liquid phase of a material A is forced into contact with a solid compound semiconductor formed of materials A and B, material B included in the solid material is melted into material A in a liquid state on the contacting plane for balancing the overall density throughout the solid semiconductor materials AB and liquid A material. At this time, the etching of the solid semiconductor is naturally attained. By this phenomenon, the etching is performed down to the substrate as shown in FIG. 6c.

Figure 6D:
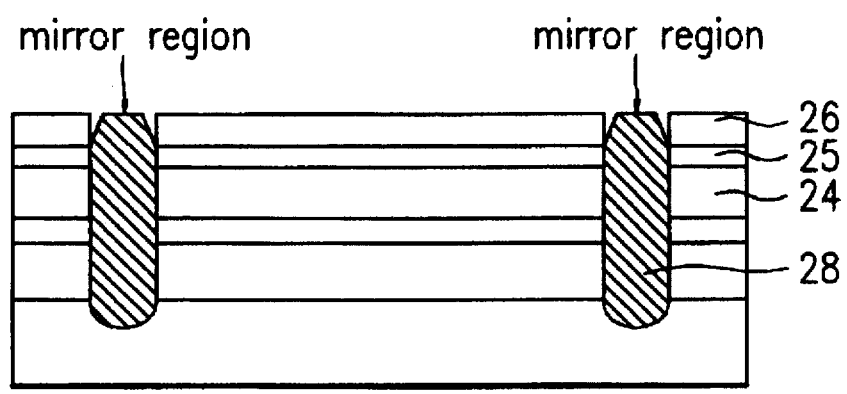

Then, as shown in FIG. 6d, a TM layer 28 of a material having a lower refractive index and a greater energy gap than those of the active layer is grown in the etched portion to easily form the high output semiconductor layer having an enhanced COD level.

Figure 6E:
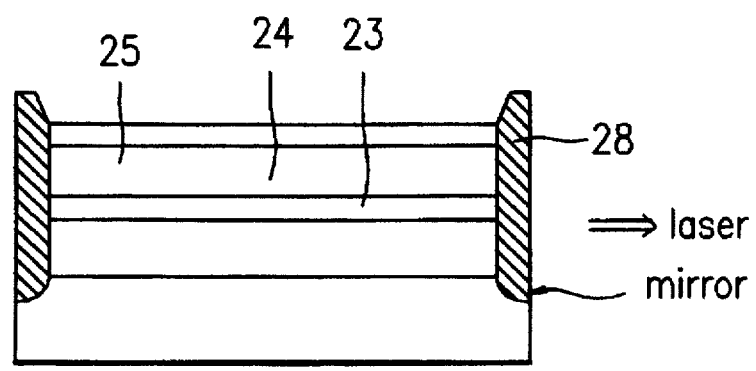

Referring to FIG. 6e, dielectric layer 26 is removed, and scribing and breaking processes are performed upon the mirror region to fabricate a laser diode chip formed with the mirror.

FIGS. 7a to 7e are sectional views showing a process of fabricating the semiconductor laser diode according to a second embodiment of the present invention.

Figure 7A:
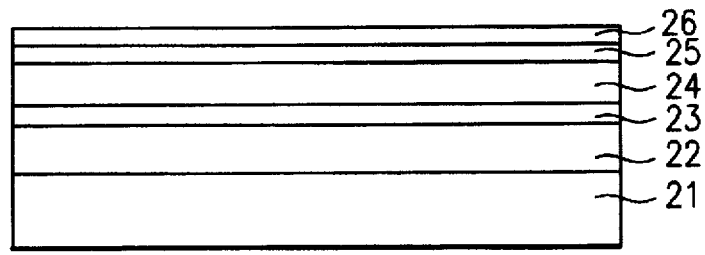

The method for fabricating the semiconductor laser diode according to the second embodiment of the present invention is performed such that, as shown in FIG. 7a, an n-type clad layer 22, an active layer 23, a p-type clad layer 24, and a p-type cap layer 25 are sequentially grown on a substrate 21 via the vapor phase epitaxy such as MOCVD and MBE or LPE to form a DH structure. A dielectric layer 26 of $SiO_2$ or $Si_3N_4$ is formed on the resultant structure via a PECVD.

Figure 7B:
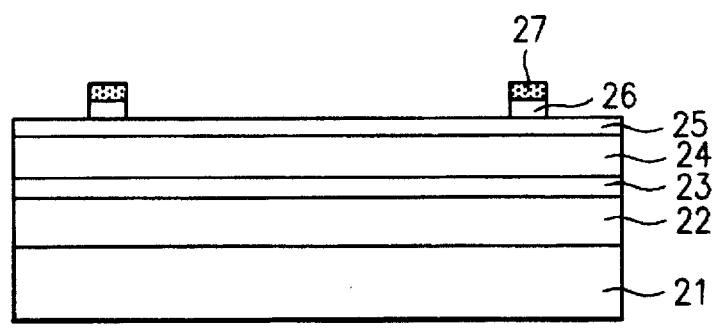

As shown in FIG. 7b, a photoresist layer 27 is formed on dielectric layer 26, and a photolithography is utilized to form a predetermined photoresist pattern. Then, dielectric layer 26 is selectively removed using HF.

Figure 7C:
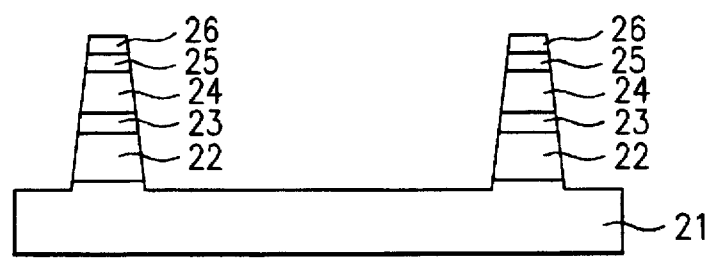

Thereafter, as shown in FIG. 7c, the resultant structure is put in an LPE reactor to etch the DH structure down to the substrate 21 using the etching method described as above.

As shown in FIG. 7d, a second clad layer 29 is regrown on the etched portion within the same reactor. At this time, second clad layer 29 is formed of a material having a lower refractive index and a greater energy gap than those of the active layer 23. For this reason, strong light confinement appears by a real index guiding. The second clad layer 29 may be formed of a single layer with a low doping density (of approximately lower than $10^{16}$) or a multilayered CBL having a pnpn thyristor structure.

As shown in FIG. 7e, dielectric layer 26 is removed, and a chip fabricating process is carried out to fabricate a semiconductor layer diode single chip having the BH structure.

Therefore, the BH-structured laser diode fabricated as above is highly reliable with respect to long-term operation. Additionally, the strong light confinement and current confinement are basically accomplished by real index guiding in the vertical and horizontal directions in the active layer, so that the semiconductor laser diode enables low current oscillation of a single mode.

Figure 8:
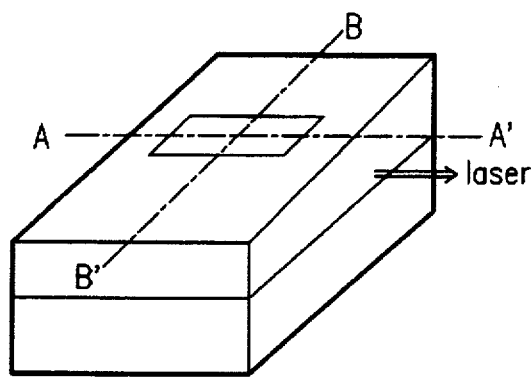
FIG. 8 is a perspective view of the semiconductor laser diode according to the present invention.
Figure 9:
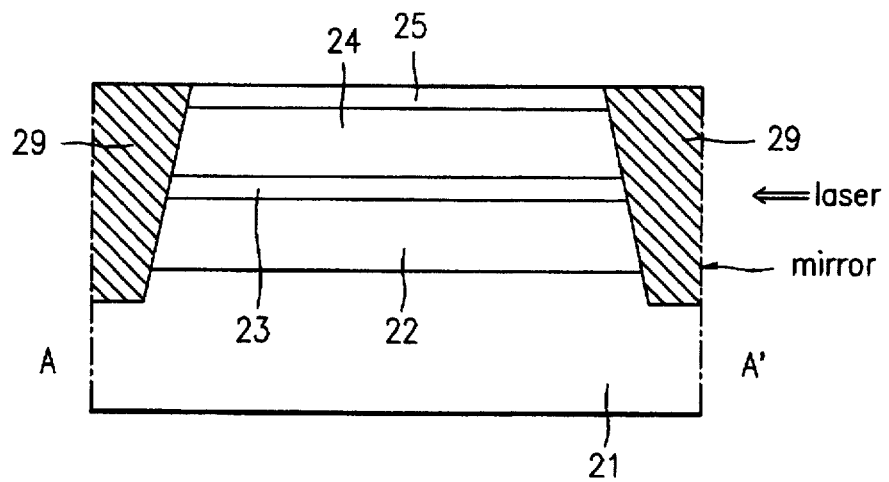
FIG. 9 is a sectional view of the semiconductor diode of FIG. 8 along line A–A'.
Figure 10:
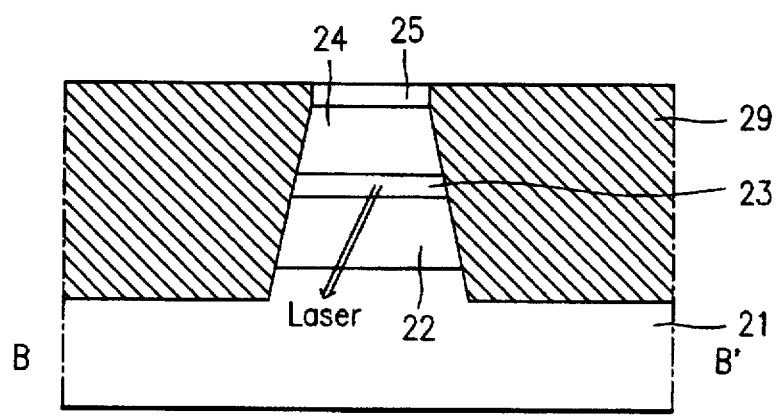
FIG. 10 is a sectional view of the semiconductor laser diode of FIG. 8 along line B–B'.

FIG. 8 is a perspective view showing the structure of the semiconductor laser diode according to a third embodiment of the present invention. FIG. 9 is a sectional view showing the structure taken along line A–A' of FIG. 8. FIG. 10 is a sectional view showing a structure taken along line B–B' of FIG. 8.

The semiconductor laser diode according to the third embodiment of the present invention, as shown in FIG. 8, has the structure of combining the semiconductor laser diode fabricated by regrowing the TM layer according to the first embodiment and the BH-structured laser diode according to the second embodiment.

That is, FIG. 9 illustrates the plane of regrowing the TM layer, and FIG. 10 illustrates the plane of regrowing the second clad layer.

The method for fabricating the semiconductor laser diode according to the third embodiment of the present invention is the same as those of the above-described first and second embodiments, in which the fabricating methods of the first and second embodiments are simultaneously carried out to fabricate the semiconductor laser diode. In other words, as shown in FIG. 6a or 7a, n-type clad layer 22, active layer 23, p-type clad layer 24, and p-type cap layer 25 are sequentially grown on substrate 21 via vapor phase epitaxy MOCVD and MBE or LPE to form the DH structure, and dielectric layer 26 of $SiO_2$ or $Si_3N_4$ is formed via the PECVD.

Successively as illustrated in FIGS. 6b and 7b, photoresist layer 27 is deposited on dielectric layer 26, and a photoresist layer pattern is formed via photolithography and dielectric layer 26 is selectively removed using HF.

At this time, the photoresist layer pattern is formed having the cavity width in the vertical direction and a predetermined width in the horizontal direction.

Subsequently, the resultant substrate is put in the LPE reactor, and the above-stated liquid phase etching method is utilized to etch the DH structure to the substrate as illustrated in FIG. 6c or 7c, and TM layer 28 or second clad layer 29 is regrown on the etched portion within the same reactor as shown in FIG. 6d or 7d. TM layer 28 or second clad layer 29 is formed of a material having a lower refractive index and energy gap greater than those of the active layer.

As shown in FIG. 6e or 7e, dielectric layer 26 is removed, and the chip fabricating process is performed to fabricate the single chip semiconductor laser diode of the BH structure.

The laser diode fabricated as above has a high COD level which results from regrowing the TM layer. This further enables high output operation as well as low current oscillation in the single mode, which is the advantage of the BH-structured laser diode.

In the method for fabricating the semiconductor laser diode according to the present invention as described above, the DH structure is etched using liquid phase etching which instantly executes the regrowth after etching the DH structure to prevent the occurrence of a defect due to an etchant. Furthermore, the structure is not exposed to air which prevents the oxidation of the etched plane, thereby preventing leakage current and abrupt degradation when using the semiconductor laser diode for long periods. As a result, easy fabrication of a semiconductor laser with high reliability is achieved.

It will be apparent to those skilled in the art that various modifications and variations can be made in the method for fabricating a semiconductor laser diode of the present invention without department from the spirit or scope of the invention. Thus, it is intended that the present invention cover the modifications and variations of this invention provided they come within the scope of the appended claims and their equivalents.

What is claimed is:

1. A method for fabricating a semiconductor laser diode including a substrate and a double hetero structured semiconductor layer, the method comprising the steps of:

forming the double hetero structured semiconductor layer on the substrate;

forming a dielectric layer on the double hetero structured semiconductor layer;

selectively removing the dielectric layer to expose a portion of the double hetero structured semiconductor layer;

selectively etching the exposed semiconductor layer using the dielectric layer as a mask by liquid phase etching; and regrowing a semiconductor layer on the etched portion by liquid phase epitaxy.

2. The method for fabricating a semiconductor laser diode according to claim 1, further comprising the steps of:

removing the dielectric layer; and scribing and breaking the regrown semiconductor layer.

3. The method for fabricating a semiconductor laser diode according to claim 1, wherein the step of forming the double hetero structure includes the steps of:

growing a first clad layer of a first conductivity type on the substrate;

growing an active layer on the first clad layer of the first conductivity type; and growing a second clad layer of a second conductivity type on the active layer.

4. The method for fabricating a semiconductor laser diode according to claim 1, wherein the removed portion of the dielectric layer corresponds to a mirror plane diode.

5. The method for fabricating a semiconductor laser diode according to claim 1, wherein the removed portion of the dielectric layer is a channel portion for forming a current confining layer to confine a laser diode current of the active layer in a horizontal direction.

6. The method for fabricating a semiconductor laser diode according to claim 1, wherein the removed portion of the dielectric layer corresponds to a channel portion for forming a current confining layer which confines a mirror plane and the active layer in the horizontal direction.

7. The method for fabricating a semiconductor laser diode according to claim 1, wherein the regrown semiconductor layer has a lower refractive index and a higher energy gap than the active layer.

8. The method for fabricating a semiconductor laser diode according to claim 1, wherein the regrown semiconductor layer includes a transparent mirror layer.

9. The method for fabricating a semiconductor laser diode according to claim 1, wherein the regrown semiconductor layer includes a clad layer.

10. A method for fabricating a semiconductor laser diode including a substrate, a first clad layer, an active layer and a second clad layer, the method comprising the steps of:

growing the first clad layer on the substrate;

growing the active layer on the first clad layer;

growing the second clad layer on the active layer;

forming a dielectric layer on the second clad layer;

selectively removing the dielectric layer to expose a portion of the second clad layer;

selectively removing the first clad layer, the active layer, and the second clad layer by liquid phase etching using the dielectric layer as a mask; and regrowing a semiconductor layer on the removed portion by liquid phase epitaxy.

11. The method for fabricating a semiconductor laser diode according to claim 10, further comprising the steps of:

removing the dielectric layer; and scribing and breaking the regrown semiconductor layer.

12. The method for fabricating a semiconductor laser diode according to claim 10, wherein the first clad layer is formed of a first conductivity type, and the second clad layer is formed of a second conductivity type.

13. The method for fabricating a semiconductor laser diode according to claim 10, wherein the removed portion of the dielectric layer corresponds to a mirror plane.

14. The method for fabricating a semiconductor laser diode according to claim 10, wherein the removed portion of the dielectric layer is a channel portion for forming a current confining layer to confine a laser diode current of the active layer in a horizontal direction.

15. The method for fabricating a semiconductor laser diode according to claim 10, wherein the removed portion of the dielectric layer corresponds to a channel portion for forming a current confining layer which confines a mirror plane and the active layer in the horizontal direction.

16. The method for fabricating a semiconductor laser diode according to claim 10, wherein the regrown semiconductor layer has a lower refractive index and a higher energy gap than the active layer.

17. The method for fabricating a semiconductor laser diode according to claim 10, wherein the regrown semiconductor layer includes a transparent mirror layer.

18. The method for fabricating a semiconductor laser diode according to claim 10, wherein the regrown semiconductor layer includes a clad layer.

* * * * *